(12) United States Patent
Moriceau et al.

(10) Patent No.: US 8,034,208 B2
(45) Date of Patent: Oct. 11, 2011

(54) DEFORMATION MODERATION METHOD

(75) Inventors: Hubert Moriceau, Saint Egreve (FR); Jean-Claude Roussin, Fontaine (FR)

(73) Assignee: Commissariat a l'Energie Atomique, Paris (FR)

( * ) Notice: Subject to any disclaimer, the term of this patent is extended or adjusted under 35 U.S.C. 154(b) by 438 days.

(21) Appl. No.: 12/276,112

(22) Filed: Nov. 21, 2008

(65) Prior Publication Data
US 2009/0133819 A1 May 28, 2009

(30) Foreign Application Priority Data
Nov. 28, 2007 (FR) ...................................... 07 59392

(51) Int. Cl.
*B29C 65/00* (2006.01)
*B32B 37/00* (2006.01)
*B32B 38/10* (2006.01)
*H01L 21/00* (2006.01)

(52) U.S. Cl. ........ 156/249; 438/197; 438/933; 438/506; 438/509

(58) Field of Classification Search .................. 156/230, 156/234, 241, 247, 272.2, 249; 438/197, 438/311, 455, 457, 459, 474, 475, 487, 505, 438/509, 514, 522, 530, 603, 604, 620, 752, 438/753, 761, 763, 765, 766, 769, 911, 506, 438/933
See application file for complete search history.

(56) References Cited

U.S. PATENT DOCUMENTS

| | | | |
|---|---|---|---|
| 5,141,894 A * | 8/1992 | Bisaro et al. | 438/479 |
| 6,756,285 B1 | 6/2004 | Moriceau et al. | |
| 7,442,657 B2 * | 10/2008 | Mantl | 438/311 |
| 2002/0187619 A1 | 12/2002 | Kleinhenz et al. | |
| 2003/0036247 A1 | 2/2003 | Eriksen et al. | |
| 2004/0067622 A1 | 4/2004 | Akatsu et al. | |
| 2005/0148163 A1 | 7/2005 | Nguyen et al. | |
| 2005/0153524 A1 | 7/2005 | Maa et al. | |

FOREIGN PATENT DOCUMENTS

| | | |
|---|---|---|
| EP | 1780794 A1 | 5/2007 |
| FR | 2 789 518 A1 | 2/1999 |
| WO | WO 2006/032948 A1 | 3/2006 |

(Continued)

OTHER PUBLICATIONS

French Preliminary Search Report Dated Nov. 28, 2007—4 pages.

(Continued)

*Primary Examiner* — Philip Tucker
*Assistant Examiner* — Sing Chan
(74) *Attorney, Agent, or Firm* — Brinks Hofer Gilson & Lione

(57) ABSTRACT

A method of transferring a layer of a first material onto a second substrate of a second material includes, a step of forming a first embrittlement plane in a first substrate in first material, by a first ion and/or atom implantation through a first face of said substrate, a step of forming a second embrittlement plane in said first substrate, by a first ion and/or atom implantation through a second face of said substrate, in order to reduce a curvature of this first substrate, a step of assembling the first and second substrates, and a step of separating a layer from the first substrate at the level of the first embrittlement plane, without separation at the level of the second embrittlement plane.

14 Claims, 4 Drawing Sheets

FOREIGN PATENT DOCUMENTS

WO WO 2010/015470 A1 2/2010

OTHER PUBLICATIONS

T. Izuhara et al., "Direct Wafer Bonding and Transfer of 10-um-Thick Magnetic Garnet Films onto Semiconductor Surfaces," Applied Physics Letters, vol. 76, No. 10, Mar. 6, 2000, pp. 1261-1263.

S. Mantl et al., "Strain Relaxation of Epitaxial SiGe Layers on Si(100) Improved by Hydrogen Implantation" Nuel. Inst. And Methods in Physics Research, Section B: Beam Interactions with Materials and Atoms, Elsevier, Amsterdam, NL, vol. 147, No. 1-4, Jan. 1, 1999, pp. 29-34.

International Search Report for International Application No. PCT/EP2009/058557, dated Sep. 3, 2009, 3 pages.

\* cited by examiner

DEFORMATION MODERATION METHOD

RELATED APPLICATIONS

The present patent document claims the benefit of priority to French Patent Application No. 07 59392, filed Nov. 28, 2007, which is incorporated herein by reference.

TECHNICAL FIELD AND PRIOR ART

The invention concerns an improved method of assembling layers on a substrate.

FIGS. 1A to 1C illustrate an embodiment of a known type of layer transfer method. These figures are transversal sectional views.

FIG. 1A shows a substrate in silicon 1 during the step of implantation of a gaseous species. To do this, the face 2 of this substrate is subjected to an ion implantation symbolised by the arrows 3. For a substrate in silicon, hydrogen may for example be implanted at an energy of 200 keV and at a dose of around $6\times10^{16}$ $H^+/cm^2$. A layer 4 is then formed constituting an embrittled area, which separates the substrate 1 into two parts: a thin film 5, situated between the implanted face 2 and the embrittled area 4, and the remaining part 6 of the substrate situated underneath the embrittled area 4.

FIG. 1B illustrates a step of joining of the face 2 of the substrate 1 on a support or stiffening substrate 7. The joining may be obtained by different means: by an adhesive substance or by direct bonding by molecular adhesion for example. A bonding layer 8 may also be used. For example, when the substrate 1 is in silicon, a layer of oxide may be formed on its face 2. If the stiffener 7 also has a layer of silicon oxide, the placing in contact of the two oxide layers then constitutes the bonding layer.

FIG. 1C illustrates a separation step, induced by thermal effect, of the thin film 5 and a remaining part 6' of the substrate 6, along the embrittled area 4. A structure 1' of silicon on insulator type (SOI structure), may thereby be obtained.

But, in such a film transfer method, based on ion implantation, then bonding, poor results are obtained when the implanted wafer 6 has a too high curvature.

The curvature of the wafer 6, not visible in FIGS. 1A-1C, corresponds to a concavity or a convexity. An example of this is represented, in an exaggerated manner, in FIG. 2A.

This curvature is characterised by an arrow or a deflection measurement, corresponding to the maximum distance h between a reference plane P (here tangential to a surface of the wafer 6) and the surface 2 of this same wafer. The curvature may be without bows, or be more complex, with warps.

The too high curvature may have been formed before implantation, or may have been caused by the ion or atom implantation.

It is also observed that, in a large number of cases, this deformation renders the surface preparation (mechanical-chemical planarisation, and the like) and direct bonding impossible.

A conventional technique of compensating this curvature consists in depositing a stressed film 9 on the face 2' of the wafer, opposite to the bonding face 2 (FIGS. 1A-1C). FIG. 2B represents the wafer 6 with its embrittlement zone 4 and its stressed film 9.

The moment, associated with the stress of the film 9, enables curvature of the wafer 6 to be compensated, if the sign and the intensity of the stress have been chosen judiciously.

Such a compensation technique enables a relatively correct bonding to be obtained at ambient temperature, according to the steps of FIGS. 1B and 1C, assuming that the wafer 7 does not have, itself, excessive deformation.

However, it is observed that transfers carried out under these conditions are sometimes of poor quality, for example if the transfer is obtained during a heat treatment.

This may be due to differences between the coefficients of thermal expansion of the stress compensation film 9, the implanted wafer 6 and the second bonded wafer 7. This heat treatment then leads to a modification of the curvature of the bonded structure.

Moreover, during the fracture step (described above in relation to FIG. 1C), the remainder 6' of the initial wafer and the compensation film 9 are suddenly subjected to a change of curvature, in fact a bending, imposed by the presence of the compensation film. The consequence of this is a high risk of rupture of the remaining part 6' of the initial wafer 6.

The sudden change of convexity (concavity) may also lead to a relative movement of the two wafers. There is therefore, also, a high risk of degradation of the surface condition of each of the two wafers, linked to an undesirable friction between the two wafers.

SUMMARY

According to the invention two embrittlement zones are used, one in the vicinity of the bonding face and the other in the vicinity of the face opposite to the bonding face. A deformation moderation or compensation effect is thereby induced.

The invention concerns in particular a method of transferring a layer in a first material onto a second substrate in a second material, comprising:

a) a step of forming a first embrittlement plane in a first substrate in first material, b) a step of forming a second embrittlement plane in said first substrate, in order to reduce a curvature of the first substrate, c) a step of assembling the first and second substrates, for exmple by direct bonding or molecular adhesion, or depositing the second substrate on the first substrate, d) a step of separating a layer from the first substrate at the level of the first embrittlement plane, without separation at the level of the second embrittlement plane.

The embrittlement zones may be obtained for example by a first and a second ion and/or atom type implantations through, respectively, the first free face of the substrate and the second free face of the substrate, opposite to the first.

The first substrate may have an initial curvature, even before step a). Or instead, such a curvature may be created or accentuated by the first ion and/or atom implantation through the first face of said substrate.

The first and second embrittlement zones are formed respectively in the vicinity of a first and a second face of the first substrate, and the assembly takes place by the first face of the first substrate.

Preferably, the first substrate has, after the step of formation of a first and a second embrittlement zone, an arrow less than 10 µm.

The implantations may be carried out substantially at the same doses and at the same energies, or at different doses and/or energies, which may be particularly advantageous in the case where the first material and the second material have different coefficients of thermal expansion or different initial curvatures.

The curvature moderation or compensation obtained by the invention is total or almost total or partial.

Moreover, there is a considerable reduction (or even disappearance) of the deformation moderation, or compensation, during step d), therefore at the same time as the separation of the layer of the first substrate.

The effect of the second implantation disappears wholly or partially, at the moment of the fracture or the separation at the level of the first implantation. The risk of rupture of the remaining part of the initial wafer, by sudden change of curvature, is therefore very considerably reduced or even eliminated.

Any relative movement of the two substrates, linked to sudden changes of curvature, is also considerably reduced or even eliminated and therefore any associated risk of degradation.

The method according to the invention maintains its efficiency at the diverse heat treatment temperatures used before the separation, unlike the prior technique based on compensation layers, in particular when there is a difference of coefficient of thermal expansion between the different substrates.

The invention applies especially to the case of a single substrate. But, generally speaking, this deformation moderation technique may be applied to any type of material, whether it is unique or composite.

The initial substrate may therefore be homogeneous, or comprise one or several deposits, on one and/or the other of its two faces (assembly face and face opposite to the assembly face).

The invention applies particularly to quite stiff substrates, difficult to deform to prepare them before bonding or for the bonding. They may be for example substrates in SiC or in sapphire or in garnet, and the like. It applies to semi-conductor substrates.

DETAILED DESCRIPTION OF SPECIFIC EMBODIMENTS

Figure 3A:
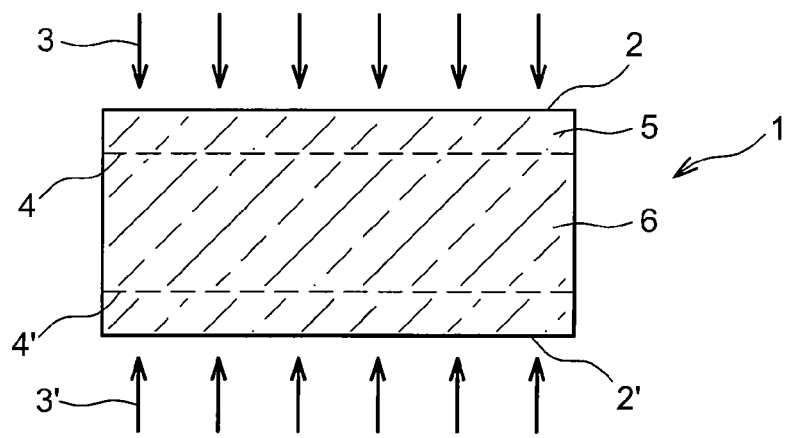
FIGS. 3A to 3D represent one embodiment of the invention.

An embodiment of the invention will now be described in relation to FIGS. 3A-3C.

According to the invention, the first substrate 6 is implanted through each of its faces 2, 2'. The face 2 is intended to be assembled with the surface of a stiffening substrate 7. As an alternative, the stiffening substrate 7 may be formed by deposition on the face 2. The face 2' is the face opposite to the face 2.

In the case of a homogeneous material, and therefore identical on the two faces, the implantations may be carried out at the same dose and at the same energy on the two faces. There is creation of stresses of the two sides or near to the two faces. The stresses and their evolutions in the implanted substrate 6 are, after the two implantations, virtually identical in the vicinity of each of the two faces 2, 2'

For each implantation, the implantation depth Rp is an average depth, from the surface of the substrate through which it is carried out. This average depth is that at which is located the maximum of the implantation profile and is linked to the implantation energy.

The implantation induces a stress, essentially situated around this implantation peak. This induced stress results in its turn in a bending moment of the substrate.

This stress, therefore the bending moment and consequently the curvature moderation of the implanted substrate, may be adapted. Thus, the nature of the ions implanted on either side may be modified, in order to vary the stress induced or to obtain a stress resulting from a certain value.

Moreover, the technique of ion or atom implantation makes it possible to implant at a constant average depth that only depends on the implantation energy and not on the shape of the surface.

This implantation of the two faces to compensate deformations enables a first implanted substrate 6 to be obtained, without, or virtually without, curvature added by the implantation, in order to have a bonding of good quality with a second substrate 7.

Figure 3B:
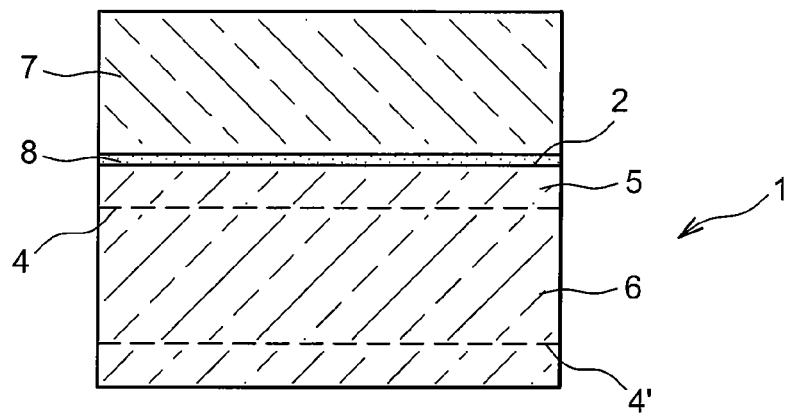

FIG. 3B illustrates the step of joining of the face 2 of the substrate 6 on a support or stiffening substrate 7, the joining being obtained by direct bonding or molecular adhesion, if necessary with one or several layers 8 for aiding or assisting the direct bonding. As already indicated, this support or stiffener substrate 7 may be obtained by depositing a thick film on the substrate 6.

Figure 3C:
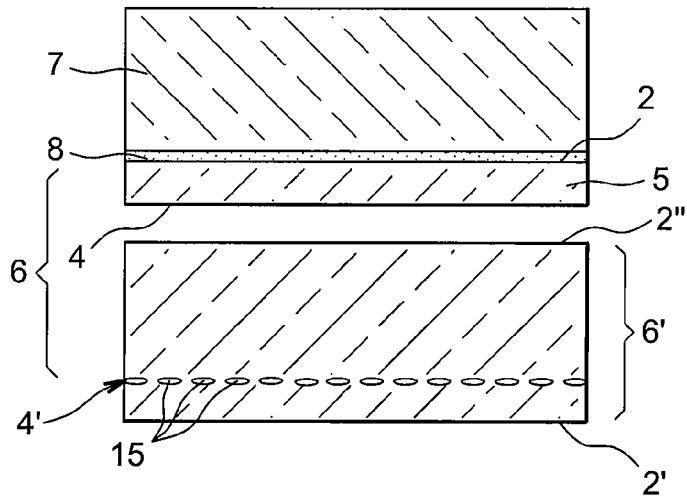

FIG. 3C illustrates the separation step, induced for example by thermal effect (at temperature of several hundreds of° C., for example between 150° C. and 1200° C., for a time that can extend from several minutes to several hours, for example between 4 h and 10 h).

Figure 1A:
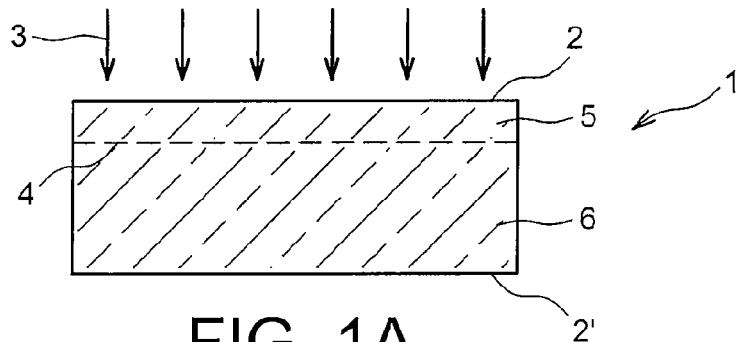
FIGS. 1A to 1C represent a method of the prior art.
Figure 1B:
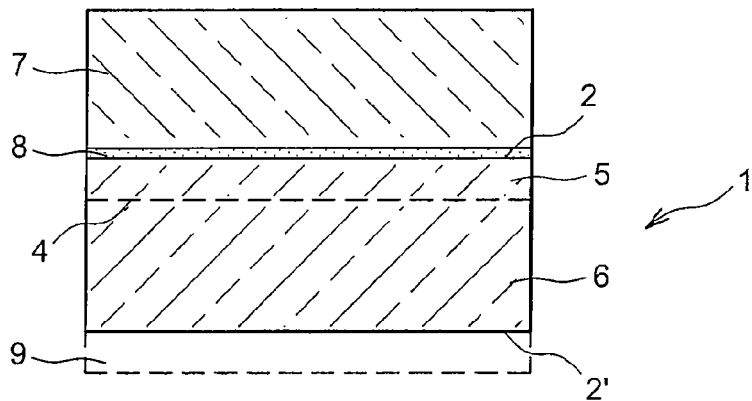
Figure 1C:
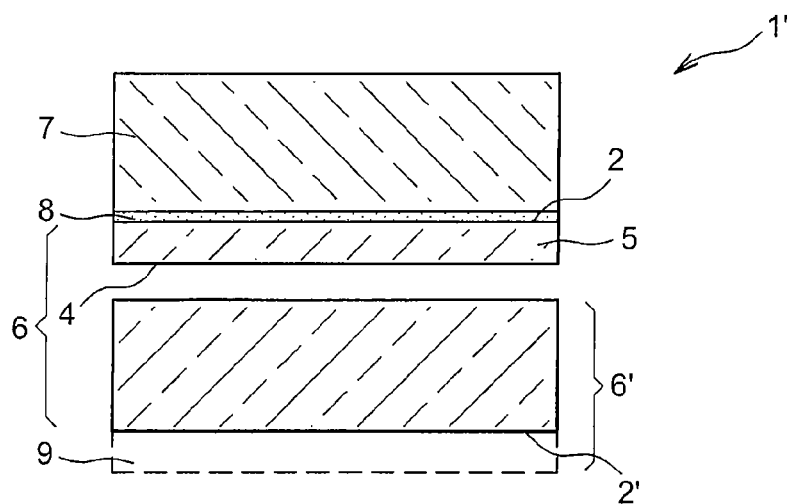

Once again, as in FIG. 1C, the thin film 5 transferred onto the second wafer 7 is taken in the initial implanted wafer 6. However, this time, the heat treatments during the steps of FIGS. 1B and 1C do not lead to undesired or harmful curvature of the doubly implanted wafer 6. Indeed the evolution of the stress is the same, or virtually the same, in the vicinity of each of the two faces 2, 2', resulting, for one face, in a fracture and, for the other face, a bubbling and/or an exfoliation.

During the fracture, the remainder 6' (FIG. 3C) of the doubly implanted wafer 6 is separated from the layer 5. This remaining portion is therefore freed, but at the same time as the stress in the vicinity of each of the two faces 2, 2'. This remainder 6' of implanted wafer is therefore not subjected suddenly to an excessive curvature. An undesirable rupture of this freed part 6' of the implanted wafer is thereby avoided.

The face 2' does not necessitate any surface preparation, since this part of the substrate 6' is not intended to be assembled with another host substrate. During the separation at the level of the plane or the zone 4, there therefore takes place, as indicated in FIG. 3C, at the level of the plane or the implanted zone 4', the formation of bubbles or blisters 15 or an exfoliation (a bursting of some of the bubbles or the blisters 15), but not a total fracture at the level of this plane or this zone 4'. This effect results in a total reduction, or almost, of the stress resulting from the implantation 4'.

If the doubly implanted wafer 6 and the second wafer 7 of the bonding have different coefficients of thermal expansion, for example such that their ratio is greater than or equal to 2, the invention is then advantageously implemented to induce a curvature modification: a different stress is voluntarily induced in the vicinity of the face to be bonded 2 and in the vicinity of the face 2', opposite to the face 2, of the first implanted wafer 6, by a difference in doses and/or implantation energies and/or by a difference in the type of ions.

Figure 3D:
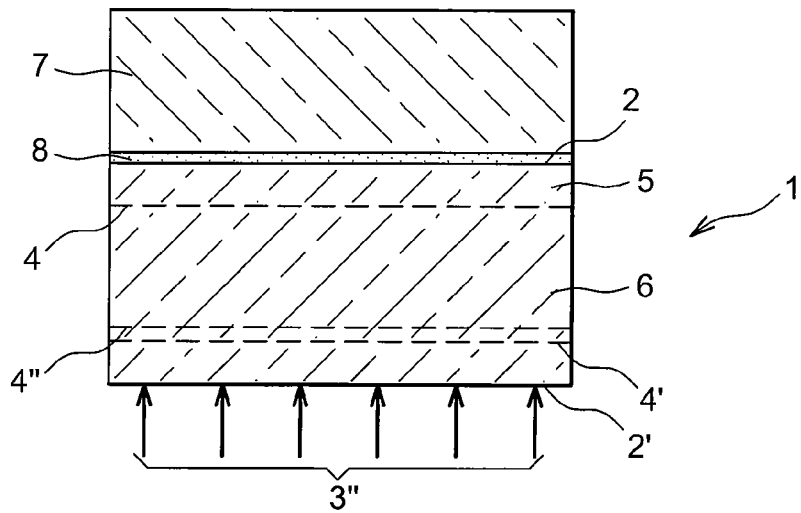

It is also possible to carry out, after assembly of the substrates 6 and 7, a second step of implantation in the substrate 6, in order to prevent at least partially a subsequent deformation of the bonded surface, which would be notably due to a difference between the coefficients of thermal expansion of the substrates 6 and 7. A second implantation step is illustrated in FIG. 3D, where a third beam 3" makes it possible to carry out, through the second face 2', a third implantation 4''', after assembly of the substrate 7 with the substrate 6, which has already undergone two implantations 3, 3' (FIG. 3A). This third implantation is going to induce a modification of the stresses, therefore the bending moment of the first wafer. This third implantation makes it possible to moderate a deformation induced subsequent to the bonding. It may be for example a deformation induced by a temperature increase.

The compensation effect disappears, at the same time on the two faces of the first wafer 6, totally or partially, at the moment of the fracture.

The moment induced by the stress difference enables the curvature of the implanted wafer 6 to be adapted to make it possible both:

to induce a direct bonding of good quality, by moderating the curvature (or the deformation) induced by atom or ion implantation of the face 2 to be bonded, and to give rise to a separation of a film 5 by fracture at the same time as a disappearance of the deformation moderation means: these means result from the stress induced by implantation, stress that disappears, or nearly, during the fracture heat treatment, due to the formation of bubbles and/or blisters and/or the exfoliation as explained above. The destruction of the remainder 6' of the implanted wafer is avoided, destruction that would be due, for example, to the sudden change of curvature.

An example of an embodiment will now be given.

Figure 4:
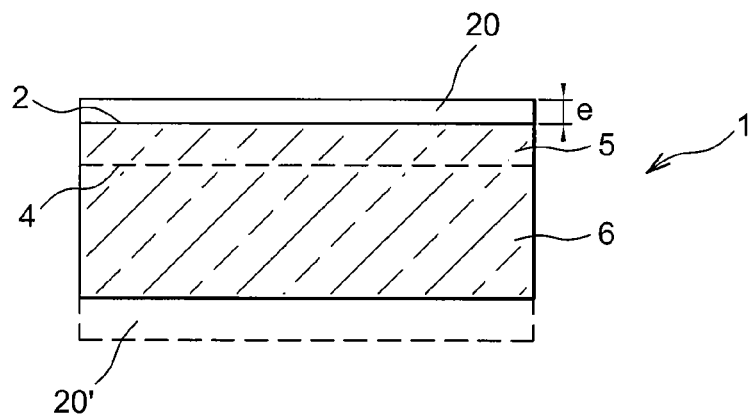
FIG. 4 represents a substrate implemented within the scope of an example of the invention.

The initial substrate 6 is a SGGG type garnet (substituted gadolinium gallate garnet, for example of composition $Gd_{3-x} Ca_x Ga_{5-y-z} Mg_y Zr_z O_{12}$) of diameter 50 mm, on which has been formed (FIG. 4), by liquid phase epitaxy, a film 20 of magnetic garnet highly concentrated in bismuth, for example of composition $Bi_{0.8} Tm_{0.25} Gd_{1.45} Pr_{y0.35})(Ga_{0.7} Fe_{4.3})O_{12}$ and of thickness e of around 0.3 µm. The arrow or the deflection of this substrate initial 6 is less than 5 µm after epitaxy.

If the technique used to perform the epitaxy is a technique of liquid phase epitaxy, an epitaxied film 20, 20' is then obtained on each of the two faces of the substrate.

An ion implantation of hydrogen ions 4, with an implantation energy of around 110 KeV and a dose of around $10^{17}$ H+ ions per square centimetre is carried out, through the film 20 of the front face 2.

Figure 2A:
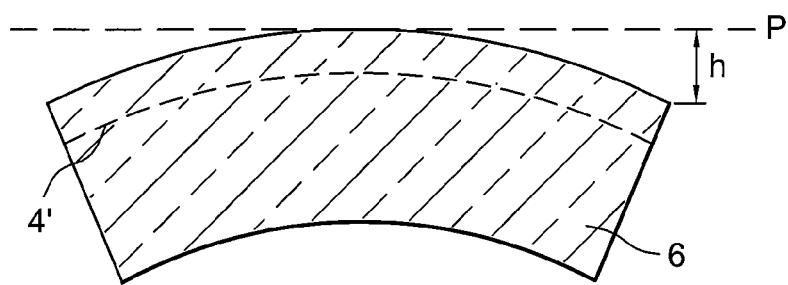
FIGS. 2A and 2B represent respectively a deformation of a substrate and a substrate equipped with a reinforcement layer.
Figure 2B:
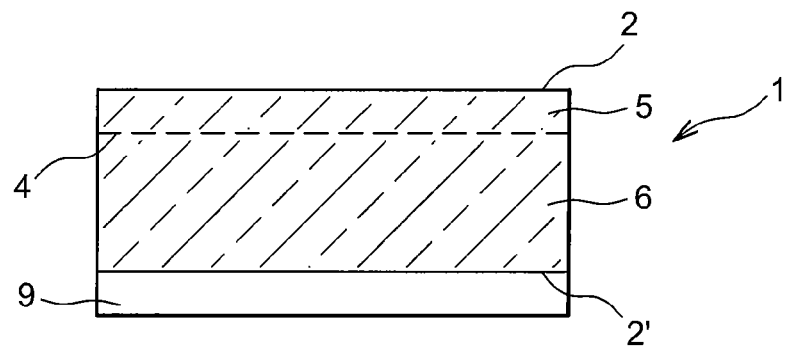

A deformation (making convex) of the implanted wafer 6 is then observed, which correspond to a compression of the zone where the implantation takes place. This deformation may be characterised by the measurement of the arrow or of the deflection induced during the implantation (as explained above in relation to FIG. 2A), this arrow or the deflection h is here around 20 µm for a measurement carried out on the diameter of the wafer. It is too high to enable a subsequent bonding of good quality, given the stiffness of the substrate SGGG.

According to the teaching of the invention, the substrate 6 is implanted on the side of the second face (through the layer 20' deposited on the rear face 2'), at the same dose and at the same energy. The wafer thereby doubly implanted has an arrow or a deflection less than 5 µm, therefore less than the initial arrow before the second implantation. A moderation of the curvature after the second implantation is thereby obtained.

A bonding of good quality may then be obtained on a host support 7 (FIG. 3B), for example a glass substrate of 50 mm diameter.

To obtain the detachment of a film 5 of the implanted wafer 6 and its transfer onto the host support 7, a heat treatment is used. In the case of garnet and the implantation under the above mentioned conditions, this heat treatment is for example 480° C. for four hours.

According to an alternative of this example, a first implantation of the substrate 6 is carried out with helium ions, at a dose of $8 \times 10^{16}$ per square centimetre and an energy of 200 KeV.

Without using the deformation moderation technique according to the invention, an arrow or a deflection of around 25 µm is observed after this first implantation 3. By using the technique according to the invention (implantation 3' through the second face 2'), the deformation is moderated and the arrow or the deflection is reduced, it is less than around 5 µm.

In this example and in its alternative, it is possible to vary the thickness of epitaxied film of magnetic garnet 20, 20', the nature of the implanted ions 4, 4', these dose(s) and/or the implantation energy/energies. This will be for example the case if the material is not identical on the two faces 2, 2'.

According to another example, a SiC substrate 6 of diameter 2.5 cm and of thickness 230 µm undergoes a deformation of about 40 µm (measured on its diameter) during a single implantation (case of FIG. 1A) of around $8 \times 10^{16} H^+ cm^{-2}$, at an energy of 120 KeV.

For a SiC wafer of 350 µm thickness, the deformation, under the same implantation conditions, is around 18 µm.

Here again, by applying the method according to the invention, by an identical implantation in the rear face 2', the deformation is moderated (or compensated). It may only be several µm, for example less than 10 µm. This means of moderation is eliminated at the same time as the separation of the film 5 is carried out, during the step of transfer onto a support 7, for example in polycrystalline SiC or in silicon.

Generally speaking, the deformation moderation technique according to the invention may be used to compensate all or part of an initial deformation of the wafer to be implanted. This advantage may be used to obtain bonding of good quality, after implantation.

This deformation moderation technique may also be used to compensate all or part of a predictable deformation of the structure after stacking or after heat treatment. In this case, it is possible for example to adapt the implanted dose to adapt the induced stress.

This signifies that the final curvature of a stacked structure depends on the stresses present in each of the wafers of the stack, by the resulting moment. If it is provided that the stacked structure will be highly curved during the fracture heat treatment, this effect could be moderated by a different ion implantation between the two implantation planes 4, 4'.

Figure 5A:
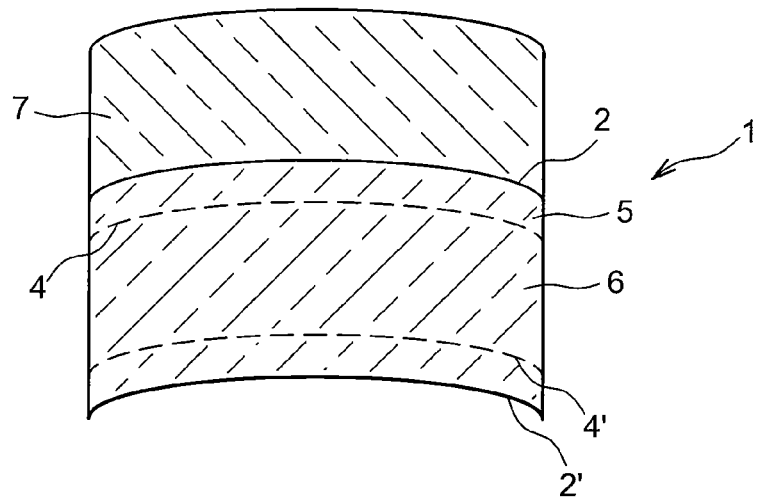
FIGS. 5A and 5B illustrate a compensation effect, by a method according to the invention, in a stacking of substrates.
Figure 5B:
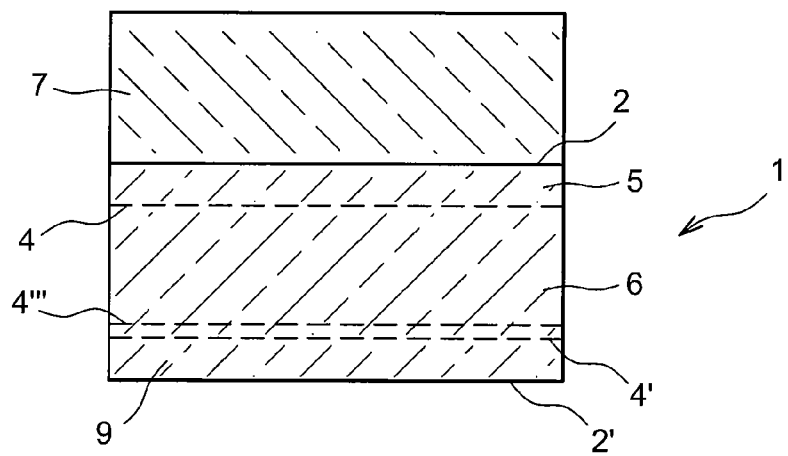

Thus FIG. 5A represents a stack of two substrates 6, 7, one of which has undergone two implantations 4, 4'. The stack further comprises a curvature, which may stem for example from a curvature of the substrate 7, this imposing a curvature on the doubly implanted substrate 6 during the assembly (and, as a result, highly compensated plane or curvature). The double implantation of the substrate 6 therefore has a curvature moderation effect, but is not sufficient. After assembly, a reinforced implantation 4''' is therefore then carried out, in the vicinity of the surface 2', which enables the curvature to be further reduced, as shown in FIG. 5B. In other words, a curvature moderation is achieved, which enables an assembly or a bonding, then any bending of the structure is put right just after assembly or bonding. Such a bending may be present as of room temperature, which is the case in particular if the wafer 7 itself has an initial deformation.

The invention claimed is:

1. A method of transferring one layer in a first material onto a second substrate of a second material, the method comprising:
   a) forming a first embrittlement plane in a first substrate of first material, by a first ion implantation or atom implantation, or both, through a first face of the first substrate;
   b) forming a second embrittlement plane in the first substrate, by a second ion implantation or atom implantation, or both, either before or after the first ion or atom implantation, through a second face of the first substrate, in order to reduce a curvature of the first substrate;
   c) assembling the first face of the first substrate with the second substrate, or depositing the second substrate on the first face of the first substrate; and
   d) separating a layer from the first substrate at the level of the first embrittlement plane, without separation at the level of the second embrittlement plane.

2. The method according to claim 1, wherein the implantations are carried out through, respectively, first and second faces at substantially the same dose and at the same energy.

3. The method according to claim 1, wherein the implantations are carried out through, respectively, first and second faces at substantially different doses or energies, or both.

4. The method according to claim 3, wherein the first material and the second material have different coefficients of thermal expansion.

5. The method according to claim 1, wherein the first substrate comprises a homogeneous wafer.

6. The method according to claim 1, wherein the first substrate comprises one or several deposits on one or the other of the first and second faces, or both the first and second faces.

7. The method according to claim 1, wherein the first material comprises a garnet type, SiC, or sapphire.

8. The method according to claim 7, wherein the first substrate comprises one or several deposits on one or the other of the first and second faces, or on both of the first and second faces.

9. The method according to claim 8, wherein the first substrate comprises one or several deposits of bismuth doped magnetic garnet on one or the other of the first and second faces, or on both of the first and second faces.

10. The method according to claim 1 further comprising, after step c) and before step d), an additional implantation step through the second face.

11. The method according to claim 1, wherein step c) is carried out by a method comprising direct bonding or molecular adhesion.

12. The method according to claim 1, wherein step d) is carried out by a method comprising a heat treatment.

13. The method according to claim 1, wherein the first substrate has a curvature before step a) and the curvature is created or accentuated by the first ion or atom implantation through the first face of said substrate.

14. The method according to claim 1, wherein before step a), a curvature is created or accentuated in the first substrate by the first ion or atom implantation through the first face of said substrate.

* * * * *